United States Patent
Chen

[11] Patent Number: 5,850,422
[45] Date of Patent: Dec. 15, 1998

[54] APPARATUS AND METHOD FOR RECOVERING A CLOCK SIGNAL WHICH IS EMBEDDED IN AN INCOMING DATA STREAM

[75] Inventor: Dao-Long Chen, Fort Collins, Colo.

[73] Assignee: Symbios, Inc., Fort Collins, Colo.

[21] Appl. No.: 505,044

[22] Filed: Jul. 21, 1995

[51] Int. Cl.⁶ .................................................. H04L 7/00
[52] U.S. Cl. .......................... 375/371; 375/375; 375/376; 370/518; 327/159; 331/60
[58] Field of Search .................................... 375/371, 373, 375/375, 376, 327; 370/517, 518; 331/1 R, 17, 57, 60; 327/145, 147, 150, 151, 152, 157, 159

[56] References Cited

U.S. PATENT DOCUMENTS

| | | | |
|---|---|---|---|
| 5,022,056 | 6/1991 | Henderson et al. | 370/517 |
| 5,276,716 | 1/1994 | Wincn | 375/376 |
| 5,491,729 | 2/1996 | Co et al. | 375/376 |
| 5,550,860 | 8/1996 | Georgiou et al. | 370/517 |
| 5,574,756 | 11/1996 | Jeong | 375/376 |

*Primary Examiner*—Don N. Vo
*Attorney, Agent, or Firm*—Paul J. Magniot; Wayne P. Bailey

[57] ABSTRACT

A method of recovering a clock signal which is embedded in an incoming data stream. The method includes the steps of providing the incoming data stream to a data sampler circuit, first operating the data sampler circuit to select one of a plurality of clock phases wherein the selected clock phase is indicative of the embedded clock signal, generating a recovered clock signal based on the selected clock phase, second operating a retiming circuit in a normal data tracking mode to retime the incoming data stream based on the recovered clock signal, and disabling operation of the data sampler circuit while the retiming circuit is operating in the normal data tracking mode. An apparatus for recovering a clock signal which is embedded in an incoming data stream is also disclosed.

16 Claims, 8 Drawing Sheets

| A | B | C | LEAD | LAG |
|---|---|---|------|-----|
| 0 | 0 | 0 | 0 | 0 |
| 0 | 0 | 1 | 0 | 0 |
| 0 | 1 | 0 | 1 | 0 |
| 0 | 1 | 1 | 0 | 1 |
| 1 | 0 | 0 | 0 | 1 |
| 1 | 0 | 1 | 1 | 0 |
| 1 | 1 | 0 | 0 | 0 |
| 1 | 1 | 1 | 0 | 0 |

APPARATUS AND METHOD FOR RECOVERING A CLOCK SIGNAL WHICH IS EMBEDDED IN AN INCOMING DATA STREAM

BACKGROUND OF THE INVENTION

The present invention relates generally to a high-speed serial data communications circuit, and more particularly to a clock/data recovery circuit for high-speed serial interfaces.

In recent years, many serial interface standards have been proposed to improve the I/O performance of a computer system or network. Clock/data recovery circuits are needed in many serial data communications systems, such as systems that implement the Asynchronous Transfer Mode (ATM) data transfer protocol, to recover an embedded clock signal from an incoming data stream. By embedding a clock signal into a transmitted data stream, a serial interface can operate at very high data rates without a timing skew problem between the clock and data signals. However, at the receiving end, a clock/data recovery circuit is needed to recover the embedded clock signal from the incoming data stream and to re-time the data. Timing jitter (i.e. the random phase jitter) on the incoming data stream is typically removed by synchronizing the received data with the recovered clock signal.

Traditionally, analog Phase-Locked Loops (PLLs) have been used to implement the clock/data recovery circuit for high-speed operations. However, while analog PLLs can generally operate at higher frequencies relative to digital PLLs, analog PLLs tend to be more difficult to design than their digital counterparts. For example, typical analog PLL design considerations include the frequency lock-in range, phase capture range, frequency drift during long strings of ones and zeros in the incoming data stream, and the phase/frequency re-acquisition process after a possible loss of bit synchronization due to a short interruption in the incoming data stream. Furthermore, analog PLLs are also more sensitive to supply noise and to variations in processing and operating conditions.

As a result, whenever the available process technology permits, analog PLLs are replaced with digital PLLs. However, there are drawbacks associated with digital PLLs in addition to their limitation on operating speed. Digital PLLs generally require more chip area than analog PLLs, and further, digital PLLs generally consume more power than analog PLLs. These limitations are usually not a significant problem when a digital PLL is provided as a stand-alone chip. But when a digital PLL is integrated with other serial interface functions, it becomes desirable to minimize both the chip area and power consumption of the clock/data recovery circuit. This is particularly true when more than one clock/data recovery circuit must be integrated on a single chip, as in many circuit or packet-switching oriented applications.

Figure 9:
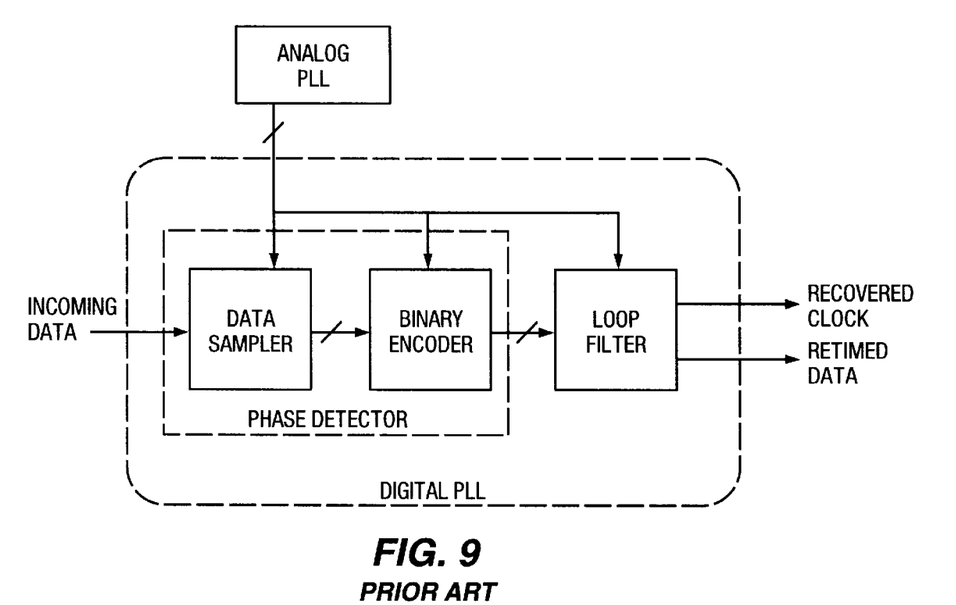
FIG. 9 is a block diagram a prior art clock/data recovery circuit.

Consequently, in recent years, a hybrid analog/digital PLL architecture has been proposed to make PLLs easy to design while conserving chip area and power consumption. FIG. 9 shows a block diagram of a prior art hybrid analog/digital PLL architecture. The analog PLL generates multiple clock phases which are equally spaced in time, for the digital PLL. By sampling the incoming data stream with the multiple clock phases, the phase detector inside the digital PLL can determine where data transitions occur. The location of a data transition is then encoded into a binary number through a binary encoder inside the phase detector. Based on the location of detected data transitions, the digital loop filter, which consists of a subtractor, multiplier, accumulator and a plurality of registers, calculates the phase difference between the incoming data stream and the recovered clock and then filters the phase difference with a digital low-pass filter to adjust the recovered clock.

Due to the complexity of their design, both the prior art phase detector and loop filter occupy a relatively large die area and consume a relatively large amount of power. By improving the design of the prior art phase detector and loop filter, the chip area and power consumption can be significantly reduced.

SUMMARY OF THE INVENTION

In accordance with one embodiment of the present invention, there is provided a method of recovering a clock signal which is embedded in an incoming data stream. The method includes the steps of providing the incoming data stream to a data sampler circuit, operating the data sampler circuit to select one of a plurality of clock phases wherein the selected clock phase is indicative of the embedded clock signal, generating a recovered clock signal based on the selected clock phase, retiming the incoming data stream based on the recovered clock signal, and disabling operation of the data sampler circuit before completion of the retiming step.

Pursuant to another embodiment of the present invention, there is provided a method of recovering a clock signal which is embedded in an incoming data stream. The method includes the steps of providing the incoming data stream to a data sampler circuit, first operating the data sampler circuit to select one of a plurality of clock phases wherein the selected clock phase is indicative of the embedded clock signal, generating a recovered clock signal based on the selected clock phase, second operating a retiming circuit in a normal data tracking mode to retime the incoming data stream based on the recovered clock signal, and disabling operation of the data sampler circuit while the retiming circuit is operating in the normal data tracking mode.

Pursuant to yet another embodiment of the present invention, there is provided an apparatus for recovering a clock signal which is embedded in an incoming data stream having an analog phase-locked loop circuit and a digital phase-locked loop circuit coupled together. The digital phase-locked loop circuit includes a data sampler circuit for selecting a clock phase indicative of the embedded clock signal, a clock multiplexer for generating a recovered clock signal based on the selected clock phase, a lead/lag phase detector circuit coupled to the clock multiplexer for retiming the incoming data stream based the recovered clock signal, and a loop filter circuit coupled to the lead/lag phase detector circuit and the clock multiplexer.

Pursuant to still yet another embodiment of the present invention, there is provided an apparatus for recovering a clock signal which is embedded in an incoming data stream. The apparatus includes a mechanism for selecting a clock phase from a plurality of clock phases wherein the selected clock phase is indicative of the embedded clock signal, a mechanism for generating a recovered clock signal based on the selected clock phase, a mechanism for retiming the incoming data stream based on the recovered clock signal in a normal data tracking mode, and a mechanism for disabling the selecting mechanism while the retiming mechanism is operating in the normal data tracking mode.

It is therefore an object of the present invention to provide a new and useful clock/data recovery circuit that can operate at higher data rates while occupying less area.

It is another object of the present invention to provide a new and useful clock/data recovery circuit that can operate at higher data rates while consuming less power.

It is a further object of the present invention to provide an improved clock/data recovery circuit which utilizes a hybrid analog/digital PLL architecture design.

It is yet another object of the present invention to provide a new and useful clock/data recovery circuit which can be used as a macrocell in different applications.

The above and other objects, features, and advantages of the present invention will become apparent from the following description and the attached drawings.

DETAILED DESCRIPTION OF THE PREFERRED EMBODIMENT

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 1:
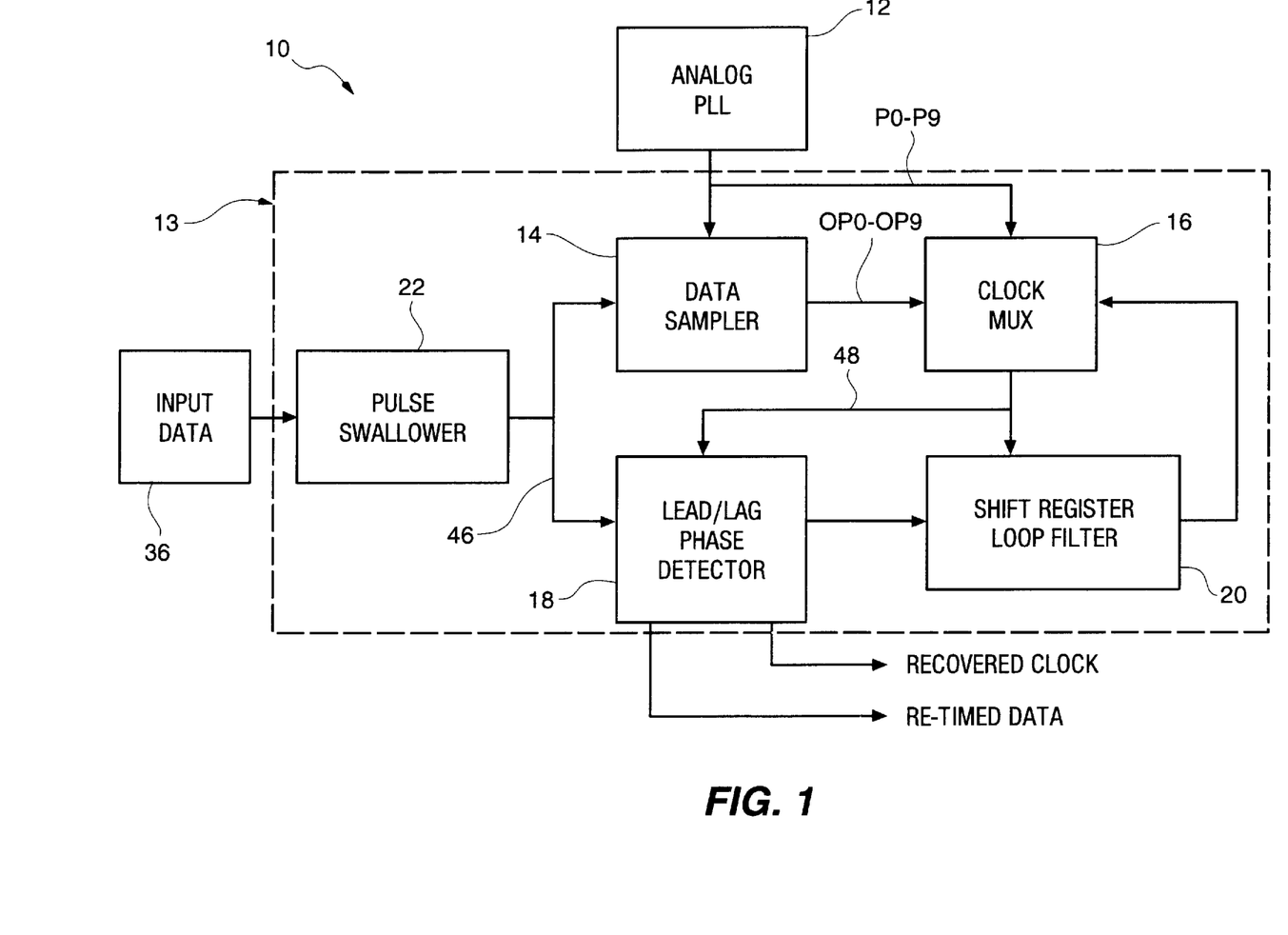
FIG. 1 is a block diagram of a clock/data recovery circuit which incorporates the features of the present invention.

Referring now to FIG. 1, there is shown a block diagram of a clock/data recovery circuit 10 which incorporates the features of the present invention therein. The clock/data recovery circuit 10 includes an analog PLL (Phase-Locked Loop) 12 and a digital PLL 13. The digital PLL 13 includes a data sampler 14, clock multiplexer 16, phase detector 18, loop filter 20 and pulse swallower 22.

Figure 2:
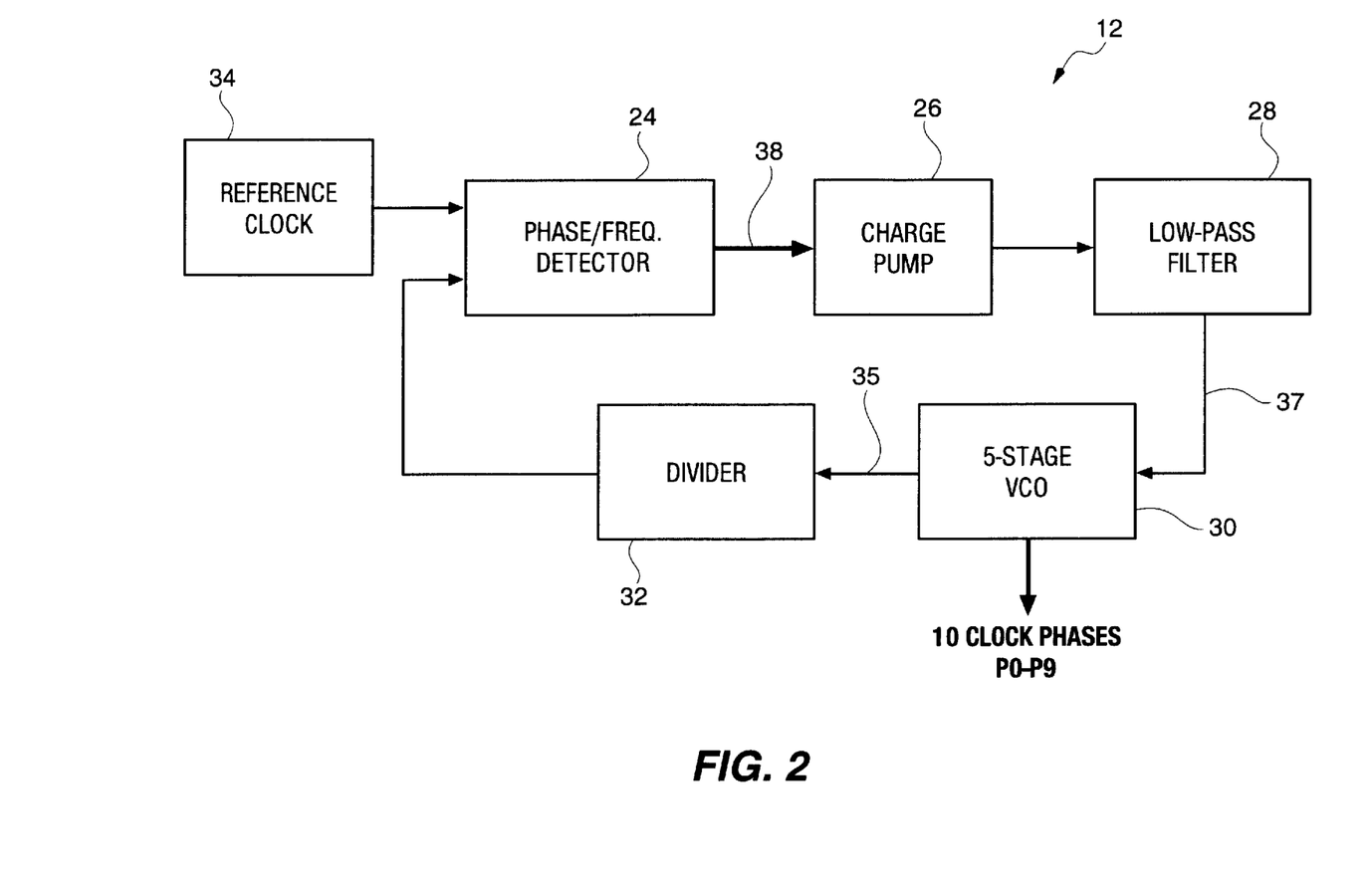
FIG. 2 is a block diagram of an analog PLL clock synthesizer of the clock/data recovery circuit of FIG. 1.

FIG. 2 is a block diagram of the analog PLL 12. The analog PLL 12 includes a phase/frequency detector 24, charge pump 26, low-pass filter 28, voltage controlled oscillator (VCO) 30 and divider 32. The analog PLL 12 functions as a clock synthesizer to generate multiple output clocks from an off-chip reference clock 34. More specifically, the analog PLL 12 generates high-speed clocks for the transmit path (not shown), and generates multiple clock phases P0–P9 which are equally spaced in time as an input to the data sampler 14 and clock multiplexer 16 of the digital PLL 13 which functions as a clock recovery circuit.

In addition to outputting the multiple clock phases P0–P9, the VCO 30 generates an output signal 35 having a frequency that varies in accordance with a control voltage 37 applied to the VCO 30. The divider 32 steps down the frequency of the VCO output signal 35 to match the frequency of the reference clock 34 thereby permitting the use of a lower frequency reference clock 34.

In the described embodiment, the VCO 30 includes five (5) differential oscillator stages (not shown) that provide ten (10) clock phases P0–P9 for oversampling by an input or incoming data stream 36 (FIG. 1) having a clock signal embedded therein. The VCO 30 operates at the same frequency as the data transfer rate of the incoming data stream 36 to reduce power consumption. In addition, the circuit and layout design of the differential oscillator cells (not shown) and clock buffers (not shown) of the VCO 30 insures a 50% duty cycle on the clock phases P0–P9. Otherwise, the input jitter tolerance will suffer due to static phase alignment error.

The phase/frequency detector 24 (FIG. 2) compares the frequency and phase of the reference clock 34 to the frequency and phase of the stepped down VCO output signal 35 to generate charge and discharge signals 38 that are related to the frequency and phase difference between the reference clock 34 and the stepped down VCO output signal 35. The charge and discharge signals 38 are applied to a conventional charge pump 26 which modifies the amount of charge stored in the low-pass filter 28 and which produces the control voltage 37 that is applied to the VCO 30. The control voltage 37 conventionally forces the frequency of the VCO output signal 35 to vary in a manner that reduces the difference between the reference clock 34 and the stepped down VCO output signal 35.

The number of multiple clock phases P0–P9 that are used for oversampling by the incoming data stream 36 directly affects the tolerance of phase jitter on the incoming data stream 36. An input jitter tolerance of greater than 60% of the bit time is attainable with a 10X oversampling rate of the present invention. Thus, the input jitter tolerance obtained from a 10X oversampling rate is adequate, provided that other sources of error such as the random jitter and duty cycle distortion on the multiple clock phases P0–P9 are properly controlled.

Figure 3:
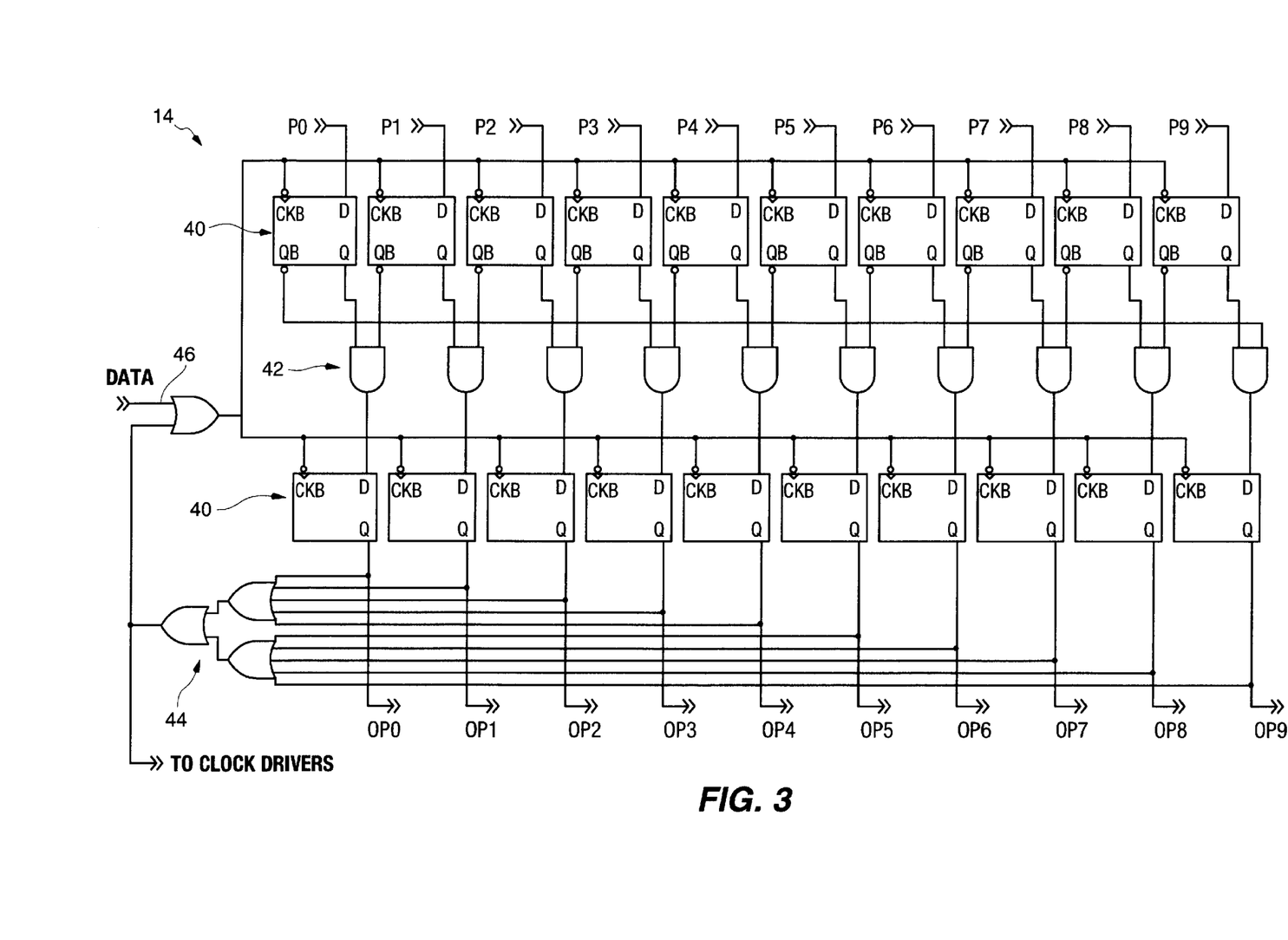
FIG. 3 is a schematic circuit diagram of a data sampler of the clock/data recovery circuit of FIG. 1.

FIG. 3 is a schematic circuit diagram of the data sampler 14. The data sampler 14 includes a plurality of D flip-flops 40, a plurality of AND gates 42 and an OR-gate feedback path 44. It should be appreciated to one of ordinary skill in the art that the D flip-flops 40 are arranged into two rows which permit the data sampler 14 to operate at higher speeds through pipelining, and which reduce the probability of any potential metastability problems due to asynchronous sampling. The data sampler 14 uses the data on line 46 to sample the multiple clock phases P0–P9 during an initial phase acquisition period. Once phase acquisition is accomplished, the data sampler 14 and the associated clock drivers (not shown) are disabled in order to reduce power consumption.

In operation, the data on line 46 is used by the D flip-flops 40 to strobe the ten clock phases P0–P9. The first high-to-low transition of the data on line 46 causes one of the AND gates 42 to switch from logic 0 to logic 1. Subsequently, one of the output signal lines, OP0–OP9 switches from logic 0 to logic 1 after the second high-to-low transition of the data on line 46.

Figure 4:
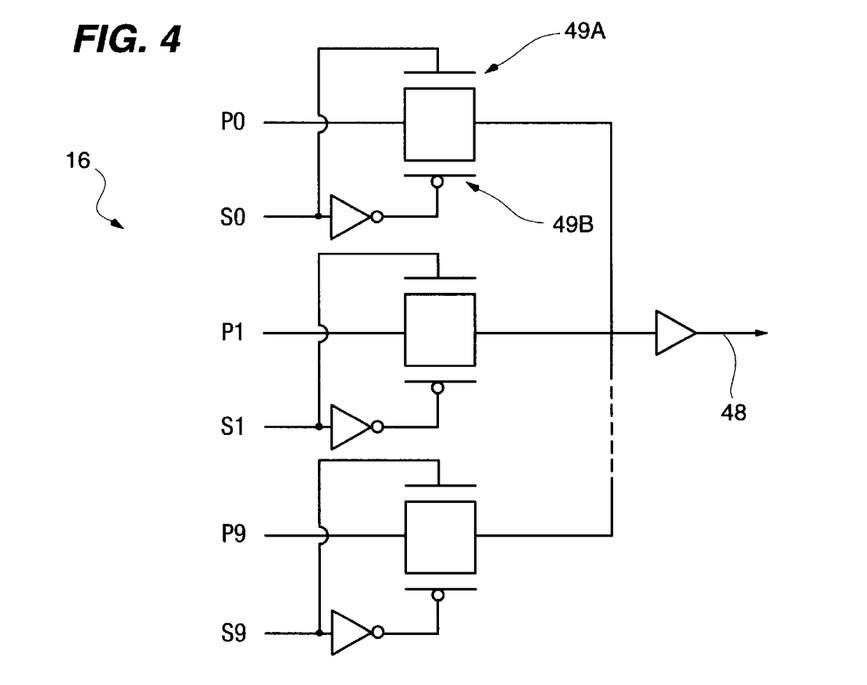
FIG. 4 is a schematic circuit diagram of a clock multiplexer of the clock/data recovery circuit of FIG. 1.

FIG. 4 is a schematic circuit diagram of the clock multiplexer 16. The output signal lines OP0–OP9 from the data sampler 14 correspond to a plurality of select signal lines S0–S9 of the clock multiplexer 16. The one output signal line OP0–OP9 that does switch to a logic 1 indicates to the clock multiplexer 16 which one of the ten clock phases P0–P9 should be initially selected via the select signal lines S0–S9 as the recovered clock signal 48 thus completing the initial phase acquisition.

Each select signal line S0–S9, when activated, enables an n-channel transistor 49a in parallel with a p-channel transistor 49b which cooperate to form a switch. When enabled, the transistors 49a, 49b output the respective clock phase P0–P9 as the recovered clock 48. Since the recovered clock 48 is frequency-locked to the reference clock 34, the digital PLL 13 can tolerate a very long string of ones and zeros. With a worst case frequency difference of 200 ppm between the embedded clock signal in the incoming data stream 36 and the recovered clock 48, it takes approximately 500 bits of consecutive ones or zeros to generate a phase shift of one-tenth of a bit time.

After the initial phase acquisition is complete, the data sampler 14 disables itself through the OR-gate feedback path 44 (FIG. 3) and the clock/data recovery circuit 10 then transitions to a normal data tracking mode wherein the loop filter 20 (FIG. 1) then determines which one of the multiple clock phases P0–P9 should be selected as the recovered clock 48 as discussed below. In operation, a logic 1 signal is fed back from one of the output signal lines OP0–OP9 to the active low CKB (CLOCK_BAR) input of each D flip-flop 40 to effectively disable the D flip-flops 40 by preventing the D flip-flops 40 from changing states while the remainder of the digital PLL 13 operates in the normal data tracking mode. Power consumption of the clock/data recovery circuit 10 is reduced because the D-flip-flops 40 draw substantially more current when the D flip-flops 40 are changing states relative to when the D flip-flops 40 are not changing states, i.e. disabled.

As a result of disabling the data sampler 14 after the initial phase acquisition, power consumption of the clock/data recovery circuit 10 is greatly reduced. Furthermore, since the data sampler 14 is not used during the normal data tracking mode, a known transition pulse generator which is part of a conventional midbit transition detector is no longer needed. This further reduces power consumption and chip area. Once disabled, the D flip-flops 40 can be enabled by applying a reset signal (not shown) to each D flip-flop 40.

With the help of the data sampler 14, the clock/data recovery circuit 10 can lock onto the incoming data stream 36 in as low as three bit times after the first low-to-high transition. The actual phase acquisition time depends on the encoding scheme used for the incoming data stream 36. If it is desirable to avoid locking onto the first few transitions of the incoming data stream 36, the pulse swallower circuit 22 (FIG. 1) can be enabled to ignore and thus remove the first two data transitions that may be unreliable.

Figure 5:
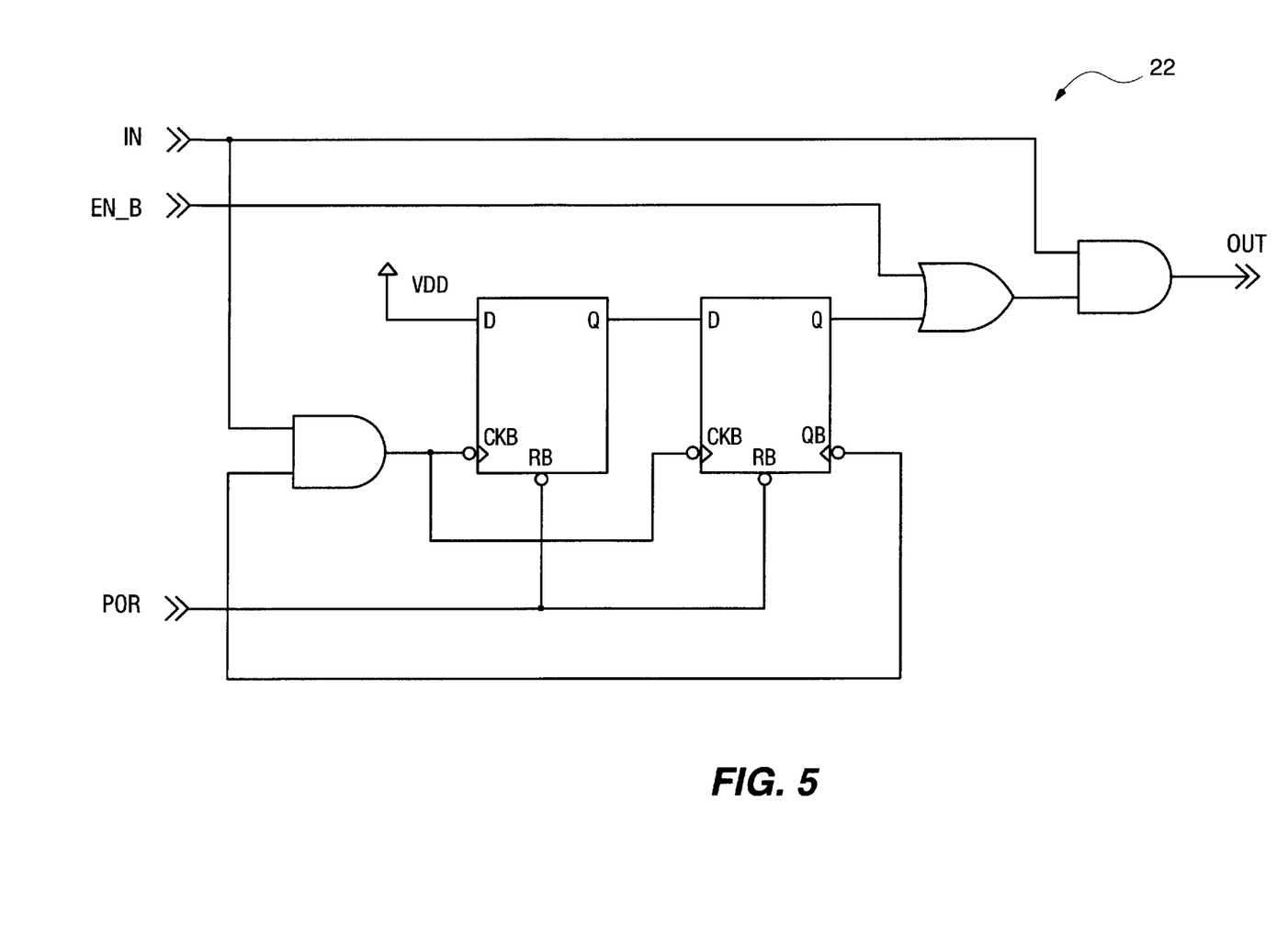
FIG. 5 is a schematic circuit diagram of a pulse swallower of the clock/data recovery circuit of FIG. 1.

FIG. 5 is a block diagram of an exemplary pulse swallower circuit 22. The active low EN_B (Enable_Bar) signal determines if the pulse swallower circuit 22 will be enabled or disabled. When the pulse swallower circuit 22 is disabled (the EN_B signal is at a logic 1), the signal on line IN will have the same logic value as the signal on line OUT and nothing changes between the signals on lines IN and OUT. When the pulse swallower circuit 22 is enabled (the EN_B signal is at a logic 0 state), the first two data pulses are swallowed by the pulse swallower circuit 22 and the next two data pulses are passed to line OUT and applied to the data sampler 14 on line 46 for use in selecting one of the ten clock phases P0–P9 as the recovered clock 48.

Once the initial phase acquisition is complete, the digital PLL 13 switches to the normal tracking mode where the digital PLL 13 is phase-locked to the incoming data stream and begins to decode the incoming data stream 36 (i.e. one of the ten clock phases P0–P9 is selected as the recovered clock signal 48 and applied to the lead-lag phase detector 18 for re-timing the incoming data stream 36). Since the analog PLL 12 is always frequency-locked to the reference clock 34, no time is spent on frequency acquisition.

Figure 6A:
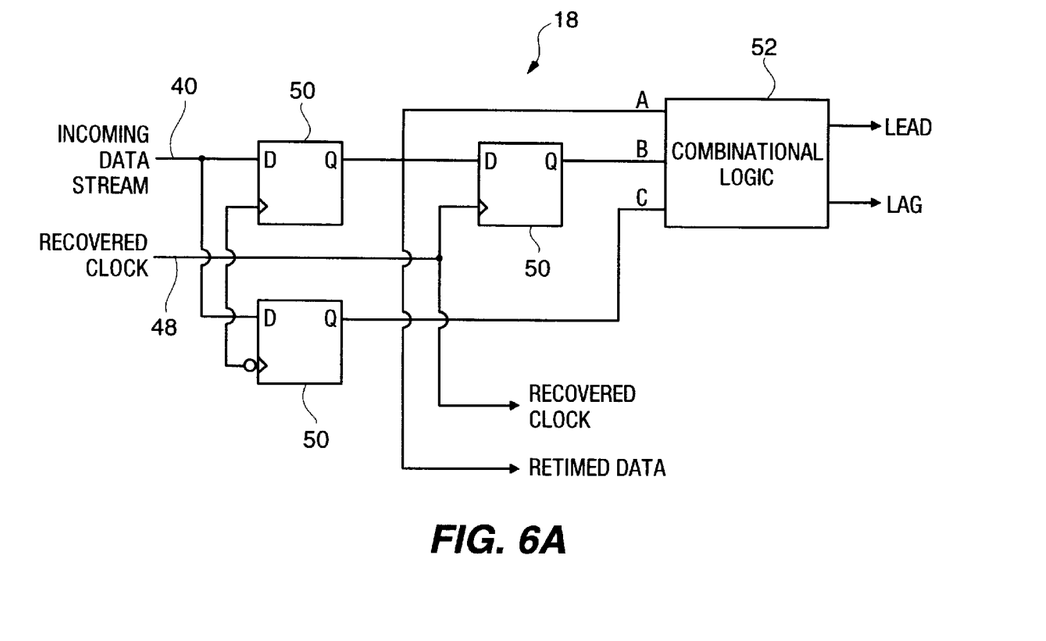
FIG. 6A is a schematic circuit diagram of a lead-lag phase detector of the clock/data recovery circuit of FIG. 1.
Figure 6B:
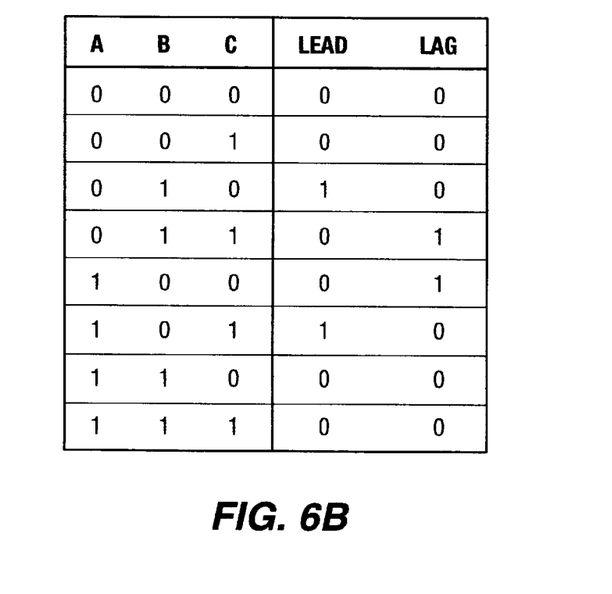
FIG. 6B is a truth table for the lead-lag phase detector of FIG. 6A.

FIG. 6A is a schematic circuit diagram of the lead-lag phase detector 18. The lead-lag phase detector 18 includes a plurality of D flip-flops 50 and combinational logic 52 which cooperate to produce LEAD and LAG output pulses which are eventually applied to the loop filter 20 (FIG. 1) after being resynchronized with the recovered clock 48. FIG. 6B is a truth table for the combinational logic 52.

It should be appreciated that the lead-lag phase detector 18 eliminates the need for a known binary encoder thereby further reducing power consumption and chip area. Another advantage of using the lead-lag phase detector 18 is that a much simpler loop filter 20 can be used. In contrast, the known clock/data recovery circuits utilize loop filters having a plurality of arithmetic units which are relatively complicated, have high power consumption requirements, and limit the maximum speed of the entire clock/data recovery circuit at higher data rates.

By using the lead-lag phase detector 18, either a simple up/down counter or a bi-directional shift register can be used to implement the loop filter 20. Although an up/down counter is smaller, a programmable bi-directional shift register is used in the preferred embodiment due to its speed. The bi-directional shift register loop filter 20 can be programmed as an 8-bit, 16-bit or 32-bit shift register to adjust the loop bandwidth, i.e. the longer the shift register, the narrower the loop bandwidth.

Figure 7:
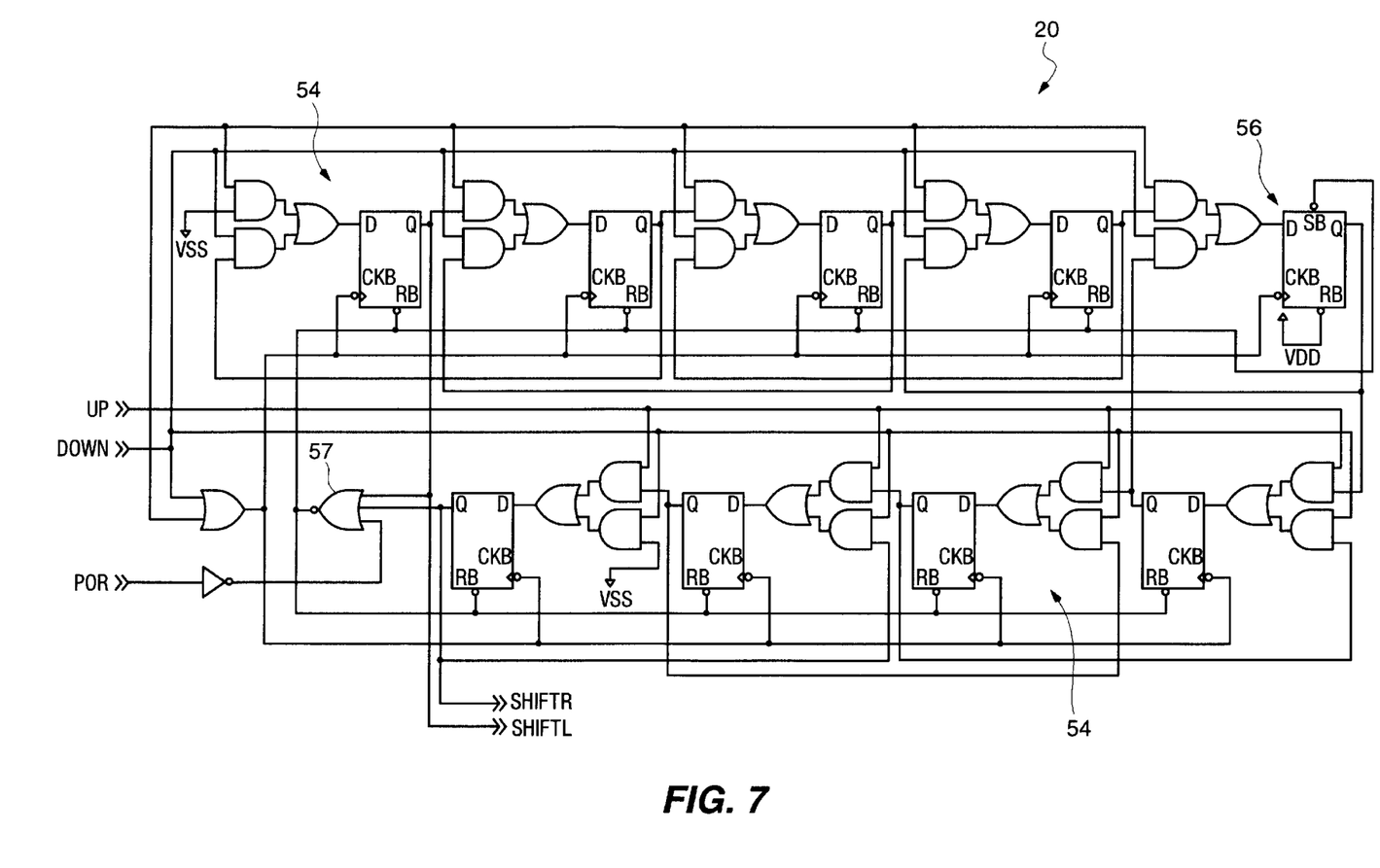
FIG. 7 is a schematic circuit diagram of a bi-directional shift register loop filter of the clock/data recovery circuit of FIG. 1.

FIG. 7 is a schematic circuit diagram of an exemplary 4-bit bi-directional shift register loop filter which includes nine (9) serially connected D flip-flop stages 54. It should be appreciated that the preferred 8-bit bi-directional shift register includes seventeen (17) serially connected D flip-flop stages 54 rather than nine stages as shown in FIG. 7. After power-up, all the outputs Q of the D flip-flops 54 are reset to zero except the output of the center D flip-flop 56.

The random phase noise on the incoming data stream 36 can be filtered out by shifting the output Q of the center flip-flop 56, which is a logic 1, to the left or to the right based on the UP and DOWN signals from the lead-lag phase detector 18. the random phase noise is the random phase jitter which causes the transitions of the incoming data stream 36 to move around an ideal position. The random phase jitter can be filtered out by the bi-directional shift register loop filter 20 because one transition which occurs too early can be canceled by the next transition which occurs too late. More specifically, one UP pulse is canceled out by one DOWN pulse, or, in other words, one shift-left is canceled out by one shift-right in the bi-directional shift register loop filter 20. It should be appreciated that the LEAD and LAG output pulses (FIG. 6) from the lead-lag phase detector 18 are re-synchronized with the recovered clock 48 from the clock multiplexer 16 before being applied to the UP and DOWN inputs respectively, of the loop filter 20 (FIG. 7).

Since it is unlikely that phase jitter will be evenly distributed around the selected clock phase P0–P9, as time elapses the logic 1 output of the center D flip-flop 56 will shift to the left-most or right-most D flip-flop 54. When this occurs, the clock phase P0–P9 selected as the recovered clock 48 will be shifted accordingly by the SHIFTR and SHIFTL output signals (FIG. 7) from of the loop filter 20. The SHIFTR and SHIFTL output signals control another shift register (not shown) which is used to select a different clock phase P0–P9 as the recovered clock 48. As a result, most of the time the recovered clock 48 jumps back and forth between two adjacent clock phases P0–P9. After the selected clock phase P0–P9 is switched, the shift register loop filter 20 will reset itself through the NOR gate 57 and return to the same initial condition after power-up.

It should be noted that, due to the finite frequency difference between the transmitter (not shown) and receiver (not shown), the recovered clock 48 will gradually shift from one clock phase P0–P9 to another over time even if there is no phase jitter. Nonetheless, since in most of the applications, the maximum frequency difference is specified at ±100 ppm or less. This happens very slowly in comparison to the bit time.

Figure 8:
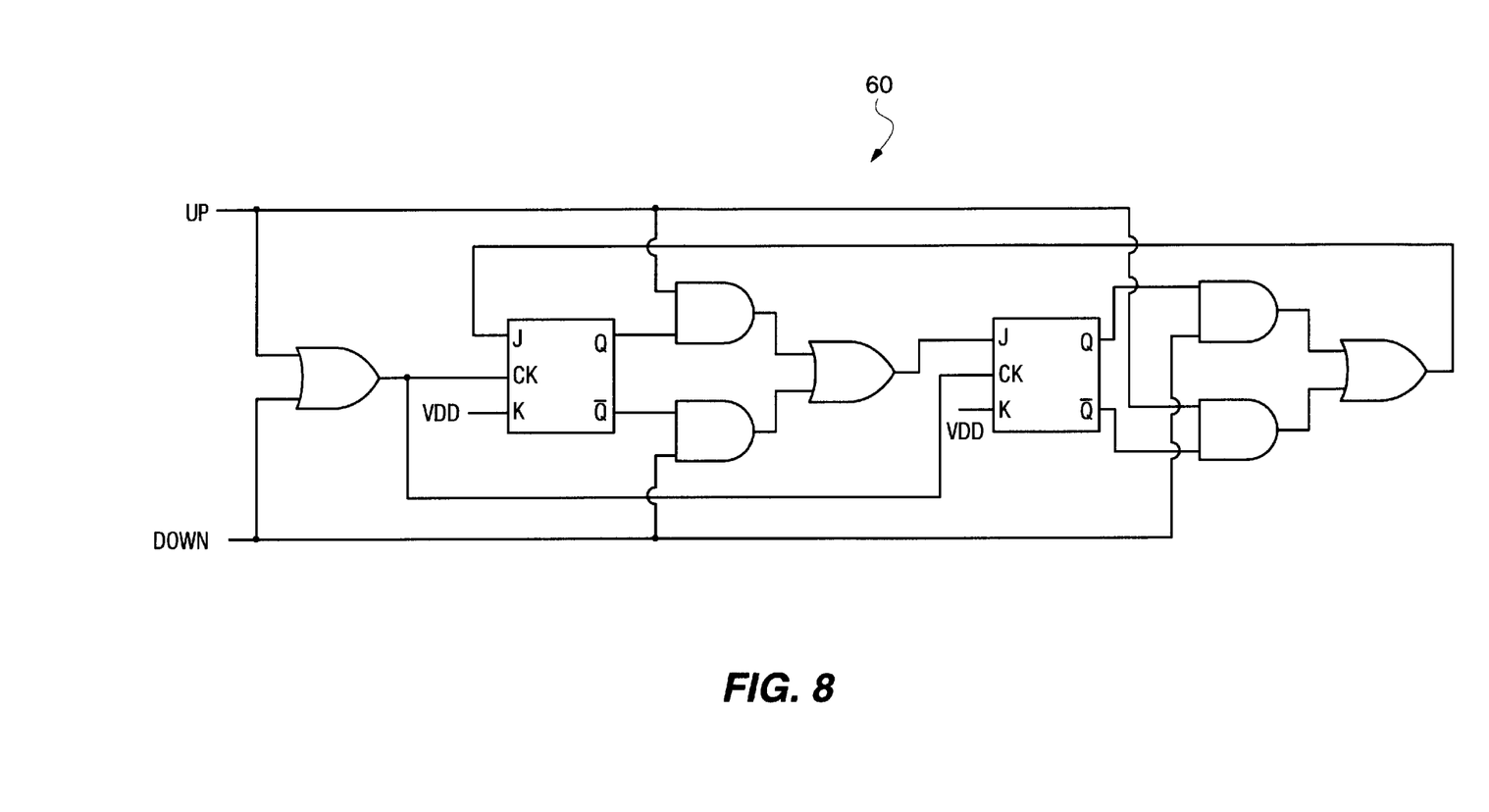
FIG. 8 is a schematic circuit diagram of an up/down counter loop filter which can be used as an alternative to the bi-directional shift register loop filter of FIG. 7.

FIG. 8 is a schematic circuit diagram of an exemplary mod-3 up/down counter 60 which can be used in place of the bi-directional shift register of FIG. 7. If the maximum operating speed is not a concern, the shift register loop filter 20 can be replaced with the up/down counter 60 to further reduce chip area and power consumption.

The clock/data recovery circuit 10 is preferably fabricated in a 0.8 $\mu$m single-polysilicon, double-metal digital CMOS process. In the embodiment being described, the analog PLL 12 has a chip area of approximately 0.44 mm$^2$, while the digital PLL 13 has a chip area of approximately 1.7 mm$^2$. The entire clock/data recovery circuit 10 can operate at data transfer rates of up to 280 Mb/s with a $2^{23}$-1 pseudo-random bit pattern input. The power consumption of the analog PLL 12 is approximately 92 mW at an operating frequency of 125 MHz with a 5 v supply. The power consumption of the digital PLL 13 is approximately 45 mW at a data rate of 125 Mb/s.

In summary, what has been disclosed in the above description is a power and area efficient clock/data recovery circuit 10 for use in high-speed operations. By combining an analog PLL 12 with a digital PLL 13, the clock/data recovery circuit 10 can tolerate long strings of ones and zeros of incoming data stream 36 since multiple clock phases P0–P9 are generated by the analog PLL 12 which is frequency-locked to a reference clock 34. The initial phase acquisition can be achieved in as low as three bit times by sampling the multiple clock phases P0–P9 with the incoming data stream 36. The data sampler 14 disables itself after the initial phase acquisition to save power. The single-phase lead-lag phase detector 18 maintains bit synchronization during the normal data tracking mode. If, for any reason, bit synchronization is lost during data transmission, the digital PLL 13 will automatically resynchronize itself with the incoming data stream 36 without external intervention since the frequency of the recovered clock 48 will never drift away. To further reduce power consumption, instead of using complicated arithmetic units, a simple shift register is used as the loop filter 20.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected.

What is claimed is:

1. A method of recovering a clock signal which is embedded in an incoming data stream, comprising the steps of:

providing the incoming data stream to a data sampler circuit;

operating the data sampler circuit to select one of a plurality of clock phases, the selected clock phase being indicative of the embedded clock signal;

generating a recovered clock signal based on the selected clock phase;

retiming the incoming data stream based on the recovered clock signal; and disabling operation of the data sampler circuit immediately after the one of the plurality of clock phases is selected.

2. A method of recovering a clock signal which is embedded in an incoming data stream, comprising the steps of:

providing the incoming data stream to a data sampler circuit;

operating the data sampler circuit to select one of a plurality of clock phases, the selected clock phase being indicative of the embedded clock signal;

generating a recovered clock signal based on the selected clock phase;

retiming the incoming data stream based on the recovered clock signal; and disabling operation of the data sampler circuit;

wherein the operating step includes the step of strobing a plurality of flip-flops of the data sampler circuit with the incoming data stream to produce the selected clock phase; and wherein the operating step further includes the step of initiating the disabling step with the selected clock phase produced in the strobing step.

3. A method of recovering a clock signal which is embedded in an incoming data stream, comprising the steps of:

providing the incoming data stream and a plurality of clock phases to a data sampler circuit;

first operating the data sampler circuit to select one of the plurality of clock phases, the selected clock phase being indicative of the embedded clock signal;

generating a recovered clock signal based on the selected clock phase;

second operating a retiming circuit in a normal data tracking mode to retime the incoming data stream based on the recovered clock signal; and disabling operation of the data sampler circuit while the retiming circuit is operating in the normal data tracking mode.

4. The method of claim 3, wherein the first operating step includes the step of:

strobing a plurality of flip-flops of the data sampler circuit with the incoming data stream to produce the selected clock phase.

5. The method of claim 3, further including the step of:

providing an analog phase-locked loop for generating the plurality of clock phases.

6. A method of recovering a clock signal which is embedded in an incoming data stream, comprising the steps of:

providing the incoming data stream to a data sampler circuit;

first operating the data sampler circuit to select one of a plurality of clock phases, the selected clock phase being indicative of the embedded clock signal;

generating a recovered clock signal based on the selected clock phase;

second operating a retiming circuit in a normal data tracking mode to retime the incoming data stream based on the recovered clock signal; and disabling operation of the data sampler circuit while the retiming circuit is operating in the normal data tracking mode;

wherein the first operating step includes the step of strobing a plurality of flip-flops of the data sampler circuit with the incoming data stream to produce the selected clock phase; and wherein the operating step further includes the step of initiating the disabling step with the selected clock phase produced in the strobing step.

7. An apparatus for recovering a clock signal which is embedded in an incoming data stream having an analog phase-locked loop circuit and a digital phase-locked loop circuit coupled together, said digital phase-locked loop circuit comprising:

a data sampler circuit for selecting a clock phase indicative of the embedded clock signal;

a clock multiplexer for generating a recovered clock signal based on the selected clock phase;

a lead/lag phase detector circuit coupled to the clock multiplexer for retiming the incoming data stream based the recovered clock signal;

a loop filter circuit coupled to said lead/lag phase detector circuit and said clock multiplexer; and means for disabling said data sampler circuit while said digital phase-locked loop circuit is operating in a normal data tracking mode.

8. An apparatus for recovering a clock signal which is embedded in an incoming data stream having an analog phase-locked loop circuit and a digital phase-locked loop circuit coupled together, said digital phase-locked loop circuit comprising:

a data sampler circuit for selecting a clock phase indicative of the embedded clock signal;

a clock multiplexer for generating a recovered clock signal based on the selected clock phase;

a lead/lag phase detector circuit coupled to the clock multiplexer for retiming the incoming data stream based the recovered clock signal; and a loop filter circuit coupled to said lead/lag phase detector circuit and said clock multiplexer.

9. The apparatus of claim 8, wherein said loop filter circuit includes a bi-directional shift register loop filter circuit.

10. The apparatus of claim 8, wherein said loop filter circuit includes a up/down counter loop filter circuit.

11. An apparatus for recovering a clock signal which is embedded in an incoming data stream having an analog phase-locked loop circuit and a digital phase-locked loop circuit coupled together, said digital phase-locked loop circuit comprising:

a data sampler circuit for selecting a clock phase indicative of the embedded clock signal;

a clock multiplexer for generating a recovered clock signal based on the selected clock phase;

a lead/lag phase detector circuit coupled to the clock multiplexer for retiming the incoming data stream based the recovered clock signal; and a loop filter circuit coupled to said lead/lag phase detector circuit and said clock multiplexer;

wherein said data sampler circuit includes a feedback circuit for disabling said data sampler circuit in response to selection of the clock phase indicative of the embedded clock signal.

12. An apparatus for recovering a clock signal which is embedded in an incoming data stream, comprising:

means for selecting a clock phase from a plurality of clock phases, the selected clock phase being indicative of the embedded clock signal;

means for generating a recovered clock signal based on the selected clock phase;

means for retiming the incoming data stream based on the recovered clock signal in a normal data tracking mode; and means for disabling said selecting means while said retiming means is operating in the normal data tracking mode, wherein said disabling means includes a feedback circuit which is coupled to said selecting means and said retiming means.

13. An apparatus for recovering a clock signal which is embedded in an incoming data stream, comprising:

means for generating a plurality of clock phases;

means for selecting a clock phase from the plurality of clock phases, the selected clock phase being indicative of the embedded clock signal;

means for generating a recovered clock signal based on the selected clock phase; and means for retiming the incoming data stream based on the recovered clock signal in a normal data tracking mode, wherein said retiming means includes a lead/lag phase detector circuit coupled to said selecting means.

14. The apparatus of claim 13, wherein said timing means further includes a bi-directional shift register loop filter circuit coupled to said lead/lag phase detector circuit.

15. An apparatus for recovering a clock signal which is embedded in an incoming data stream, comprising:

means for generating a recovered clock signal based on the selected clock phase;

means for retiming the incoming data stream based on the recovered clock signal in a normal data tracking mode;

means for disabling said selecting means while said retiming means is operating in the normal data tracking mode; and a five-stage voltage controlled oscillator for generating the plurality of clock phases, wherein the plurality of clock phases is ten clock phases.

16. An apparatus for recovering a clock signal which is embedded in an incoming data stream, comprising:

means for generating a plurality of clock phases;

means for selecting a clock phase from the plurality of clock phases, the selected clock phase being indicative of the embedded clock signal;

means for generating a recovered clock signal based on the selected clock phase;

means for retiming the incoming data stream based on the recovered clock signal in a normal data tracking mode; and means for disabling said selecting means while said retiming means is operating in the normal data tracking mode.

* * * * *